(12) United States Patent  
Joshi et al.

(10) Patent No.: US 8,184,475 B2  
(45) Date of Patent: May 22, 2012

(54) ROBUST LOCAL BIT SELECT CIRCUITRY TO OVERCOME TIMING MISMATCH

(75) Inventors: Rajiv V. Joshi, Yorktown Heights, NY (US); Rouwaida N. Kanj, Round Rock, TX (US); Antonio R. Pelella, Highland Falls, NY (US); Sudesh Saroop, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 12/705,780

(22) Filed: Feb. 15, 2010

(65) Prior Publication Data

US 2011/0199817 A1    Aug. 18, 2011

(51) Int. Cl.
    *G11C 11/41*    (2006.01)
(52) U.S. Cl. ........................ 365/156; 365/205
(58) Field of Classification Search .................. 365/156, 365/205
    See application file for complete search history.

(56) References Cited

U.S. PATENT DOCUMENTS

| | | | |
|---|---|---|---|
| 7,102,946 B2 | 9/2006 | Pelella | |
| 7,113,433 B2 | 9/2006 | Chan et al. | |
| 2004/0257860 A1* | 12/2004 | Fenstermaker et al. | 365/156 |
| 2008/0151605 A1* | 6/2008 | Goel | 365/156 |
| 2008/0170430 A1* | 7/2008 | Miller et al. | 365/156 |
| 2008/0186752 A1* | 8/2008 | Kim | 365/63 |

* cited by examiner

*Primary Examiner* — Michael Tran  
(74) *Attorney, Agent, or Firm* — Daryl K. Neff

(57) ABSTRACT

An integrated circuit can include an SRAM array having cells arranged in columns, each column being connected to true and complementary read local bitlines RLBLT and RLBLC. A local bit-select circuit can be connected to the cells of a column of the SRAM array, which can include first and second pull-down devices for pulling down a respective one of RLBLT and RLBLC at a timing controlled by a write control signal WRT. The circuit can include cross-coupled p-type field effect transistors ("PFETs") including a first PFET having a gate connected to RLBLT and having a drain connected to RLBLC, and a second PFET of the pair having a gate connected to RLBLC and having a drain connected to RLBLT. A first device can control a strength of the cross-coupled PFETs. A pair of cross-coupled n-type field effect transistors ("NFETs") can have gates connected to gates of the first and second pull-down devices. A second device can control a strength of the cross-coupled NFETs. The operation of the first and second devices can be controlled by applying first and second signals having programmed levels thereto. The levels of the first and second signals may selectively activate either the first device or the second device, so as to activate either the cross-coupled PFETs or the cross-coupled NFETs at one time.

20 Claims, 5 Drawing Sheets

ROBUST LOCAL BIT SELECT CIRCUITRY TO OVERCOME TIMING MISMATCH

BACKGROUND OF THE INVENTION

1. Field of the Invention

The present invention relates to memory, especially static random access memory ("SRAM"), and more particularly to robust local bit select circuitry for overcoming timing mismatch, and a corresponding method of operation.

2. Description of the Related Art

A static random access memory ("SRAM") is commonly used in digital electronics systems to provide fast access to locally stored data, such as to data stored in a cache associated with a processor. In typical SRAMs, a memory cell can either be read from or written to in one cycle of the memory. However, dual port SRAMs can have circuitry which permits a single memory cell to be read from and written to at the same time.

Some SRAM designs have a plurality of memory arrays, and include circuitry which allows some of the control signals which operate the SRAM to be utilized by the memory cells of more than one of the memory arrays. For example, in such SRAM, a pair of complementary global signals WRITE GLOBAL BITLINE TRUE (WGBLT) and WRITE GLOBAL BITLINE COMPLEMENT (WGBLC) transmit write global bitline values to a selected one of two or more complementary pairs of read local bitlines READ LOCAL BITLINE TRUE (RLBLT0) and READ LOCAL BITLINE COMPLEMENT (RLBLC0); or another pair of read local bitlines (not shown). In turn, the selected read local bitline pair transmits the bitline write values to a selected memory cell connected to the read local bitline pair.

SRAM designs which include a plurality of memory arrays and which transfer signals from global bitlines to read local bitlines in the above-discussed manner can be subject to timing mismatches in the signals used to control the reading from and writing to of memory cells. The timing mismatch is best discussed with reference to FIG. 1A, which illustrates a local bit-select circuit 10 according to the prior art. With reference to FIG. 1B, particular conventions are followed herein when referring to the respective gate, source and drain terminals of p-type field effect transistors. As referred to herein throughout, the gate terminal of a PFET is identified by reference letter "G", the source terminal, which is usually connected to a higher voltage than the drain terminal, e.g., supply voltage Vs, is identified by reference "S", and the drain terminal is identified by reference "D". These conventions are used throughout, whether or not each such terminal is so marked in the figures. Similarly, as seen in FIG. 1C, and as referred to herein throughout, the gate terminal of an NFET is identified by reference letter "G", the source terminal, which is usually connected to a lower voltage than the drain terminal, e.g., ground, is identified by reference "S", and the drain terminal is identified by reference "D".

As seen in FIG. 1A, a local bit-select circuit includes a pair of pull-up devices 20 or "reset" devices which can be implemented using p-type field effect transistors ("PFETs") having source terminals connected to a power supply voltage Vdd and drain terminals connected to the respective read local bitlines RLBLT0 and RLBLC0. These devices 20 can be used to pull up the value of the read local bitlines to Vdd prior to reading from or writing to a memory cell connected to the read local bitlines. The power supply voltage Vdd typically is the same as that which supplies power to each of the memory cells (not shown) of the SRAM.

The local bit-select circuit 10 also includes pull-down devices 30, which can be implemented using n-type field effect transistors ("NFETs"), for example. The pull-down devices have gates connected to write global bitlines WGBLT and WGBLC and sources connected to a drain of a write control device 40. During a write operation, the SRAM memory cell is activated to be written, such as by raising a voltage on a wordline connected to the memory cell. At that time, the write global bitlines WGBLT and WGBLC are supplied with write bit values. Then, a write control signal WRT draws current through the write control device 40, which in turn, activates the pull-down devices 30 to cause the bit value on one of RLBLT0 and RLBLC0 to be driven to the low signal level.

However, a problem occurs when there is timing mismatch between some signals. When the write control signal is delayed in relation to the wordline activation, the activated memory cell can operate in a way that resembles a read operation from the selected memory cell. In other words, the delay of the write control signal can cause the value stored in the selected memory cell to begin driving a read signal from the selected memory cell onto one of the read local bitlines. For example, a read signal can drive the bit signal value on one of the pair of read local bitlines RLBLT0 and RLBLC0 to a low signal level. Such problem can be referred to as a "false" read, wherein a strong signal from one of the memory cells on the read local bitlines can interfere with writing the same memory cell.

The read signal appearing on the read local bitline can make it harder to write the new value to the memory cell when the write control signal arrives to begin writing the selected memory cell. For example, if the signal to be written on the read local bitline RLBLT0 is a high signal level, a low signal level appearing as a read signal on RLBLT0 can interfere with driving the high signal level on that read local bitline.

This concern remains inadequately addressed in other local bit-select circuits. One prior art circuit illustrated in FIG. 2 includes a pair of cross-coupled PFETs 50 used to latch the signals on the read local bitlines RLBLT0 and RLBLC0. One effect of such approach is that the cross-coupled PFETs can latch values on the read local bitlines in the interval between a time that RESET is active and when WRT becomes active. Before the WRT signal becomes active, the read local bitlines RLBLT0 and RLBLC0 can have noise thereon or a combination of noise with read signals from the memory cell which is being written at the time. While the cross-coupled PFETs may be able to switch from a state latched prior to the WRT signal to a different state when the WRT signal arrives, the local bitline control circuit may have to work hard to overcome the earlier latched state produced by the cross-coupled PFETs. A potential effect of such approach is that the circuit may need greater current or more time to change the state of the read local bitlines RLBLT0 and RLBLC0 from the state prior to the WRT signal to the state dictated by the WGBLT and WGBLC signals for writing the memory cell.

Another prior art circuit illustrated in FIG. 3 includes a pair of cross-coupled NFETs 60 used to latch values on the read local bitlines RLBLT0 and RLBLC0. As seen in FIG. 3, the cross-coupled NFETs 60 can be supplied at the drains thereof with a column select power supply voltage (Vcs). Such power supply voltage can be raised above the level of the regular power supply (Vdd) to memory cells of the SRAM by an amount of the NFET threshold voltage $V_T$, so that the cross-coupled NFETs 60 can latch signals on the read local bitlines RLBLT0 and RLBLC0 at full rail-to-rail levels. A potential disadvantage of such approach is that the circuit may need greater current or more time to latch the read local bitlines RLBLT0 and RLBLC0 to the states dictated by the WGBLT and WGBLC signals for writing the memory cell.

In view of the foregoing, further improvement would be desirable to address the read-before-write effect which can occur due to timing mismatch in an SRAM.

SUMMARY OF THE INVENTION

As used hereinafter, "true and complementary read local bitlines RLBLT and RLBLC" shall refer to the bitlines of any one pair of true and complementary read local bitlines which are connected to the same memory cells of the same memory array. For example, "true and complementary read local bitlines RLBLT and RLBLC" can mean a pair of true and complementary read local bitlines RLBLT0 and RLBLC0 as further described herein, or can mean a pair of true and complementary read local bitlines RLBLT1 and RLBLC1 as further described herein, etc.

An integrated circuit can include an SRAM array having cells arranged in columns, each column being connected to true and complementary read local bitlines RLBLC and RLBLT. A local bit-select circuit can be connected to the cells of a column of the SRAM array, wherein the local bit-select circuit can include first and second pull-down devices operable to pull down a respective one of RLBLT and RLBLC at a timing controlled by a write control signal WRT. The circuit can include a pair of cross-coupled p-type field effect transistors ("PFETs"), including a first PFET having a gate connected to RLBLT and having a drain connected to RLBLC, and a second PFET of the pair having a gate connected to RLBLC and having a drain connected to RLBLT. A first device can control a strength of the cross-coupled PFETs. A pair of cross-coupled n-type field effect transistors ("NFETs") can have gates connected to gates of the first and second pull-down devices. A second device can control a strength of the cross-coupled NFETs. The operation of the first and second devices can be controlled by applying first and second signals thereto, respectively, the first and second signals having programmed levels.

In one embodiment, the programmed levels can be less than a voltage of at least one of said first or second voltage supplies. The levels of the first and second signals can be selected so as to selectively activate either the first device or the second device. In that way, either the cross-coupled PFETs or the cross-coupled NFETs can be activated at one time.

In accordance with another embodiment of the invention, an integrated circuit can include a sense amplifier for amplifying bit signals for reading from and writing to a memory array. The sense amplifier can include first and second pull-down devices, each having a current conduction path connected to one of a pair of true and complementary read local bitlines RLBLT and RLBLC to pull down a voltage of a respective one of RLBLT and RLBLC at a timing controlled by a write control signal WRT. A pair of cross-coupled p-type field effect transistors ("PFETs") can be included in the sense amplifier, including a first PFET having a gate connected to RLBLT and having a drain connected to RLBLC, and a second PFET of the pair having a gate connected to RLBLC and having a drain connected to RLBLT. A first device of the sense amplifier can have a current conduction path connected between sources of the cross-coupled PFETs and a first voltage supply. The sense amplifier can include a pair of cross-coupled n-type field effect transistors ("NFETs") including a first NFET having a gate connected to RLBLT and having a drain connected to RLBLC, and a second PFET of the pair having a gate connected to RLBLC and having a drain connected to RLBLT. A second device can have a current conduction path connected between sources of the cross-coupled NFETs and a second voltage supply. The first and second devices can be controlled by applying a first signal to the first device, and applying a second signal to the second device. The first and second signals can have programmed levels, wherein the programmed levels can be less than a voltage of at least one of said first or second voltage supplies. In this way, the first and second signals can be operable to activate the first device and the second device at timings controlled in accordance with the programmed levels of the first and second signals.

In accordance with another embodiment of the invention, a method is provided which includes operating a local bit-select circuit of a static random access memory ("SRAM"), the static random access memory ("SRAM") array including a multiplicity of memory cells, each memory cell being connected to true and complementary read local bitlines RLBLT and RLBLC. The operating may include applying a first signal to a first device having a current conduction path connected between sources of cross-coupled PFETs and a first voltage supply, wherein the PFETs have drains connected to the respective read local bitlines. The operating can include applying a second signal to a second device having a current conduction path connected between drains of the cross-coupled NFETs and a second voltage supply. The first and second signals can have programmed levels, wherein the programmed levels can be less than a voltage of at least one of said first or second voltage supplies. The first and second signals may selectively activate either the first or the second devices, so as to selectively activate either the cross-coupled PFETs or the cross-coupled NFETs.

In one embodiment, the programmed levels of the first and second signals can control a variable strength of the cross-coupled PFETs or the cross-coupled NFETs. Such operation, in one embodiment can operate to reduce a fast-read-before-write effect when the local bit-select circuit receives a write control signal after a selected memory cell is activated.

DETAILED DESCRIPTION

Figure 1A:
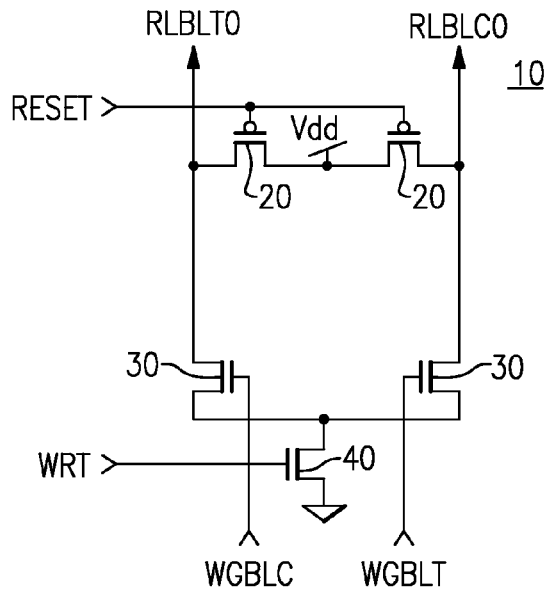
FIG. 1A is a schematic diagram illustrating a local bit-select circuit of a static random access memory according to the prior art.
Figure 1B:
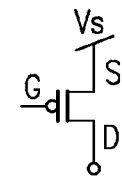
FIG. 1B is a schematic diagram illustrating a PFET according to the prior art.
Figure 1C:
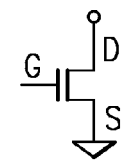
FIG. 1C is a schematic diagram illustrating an NFET according to the prior art.
Figure 2:
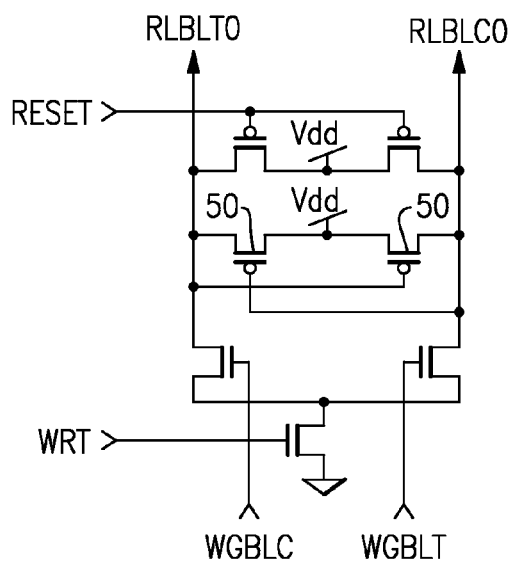
FIG. 2 is a schematic diagram illustrating a variation of a local bit-select circuit of a static random access memory according to the prior art.
Figure 3:
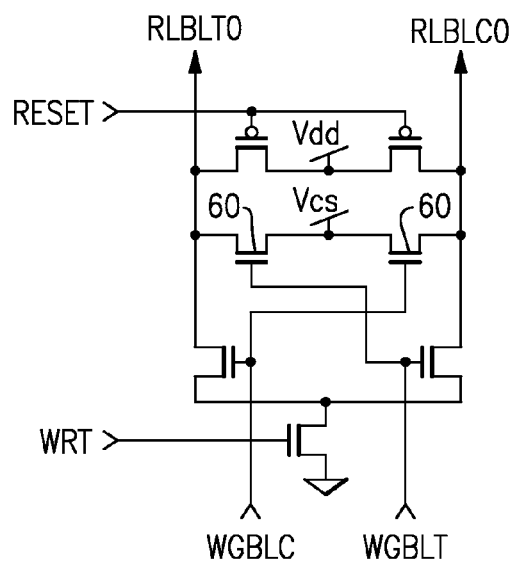
FIG. 3 is a schematic diagram illustrating another variation of a local bit-select circuit of a static random access memory according to the prior art.
Figure 4:
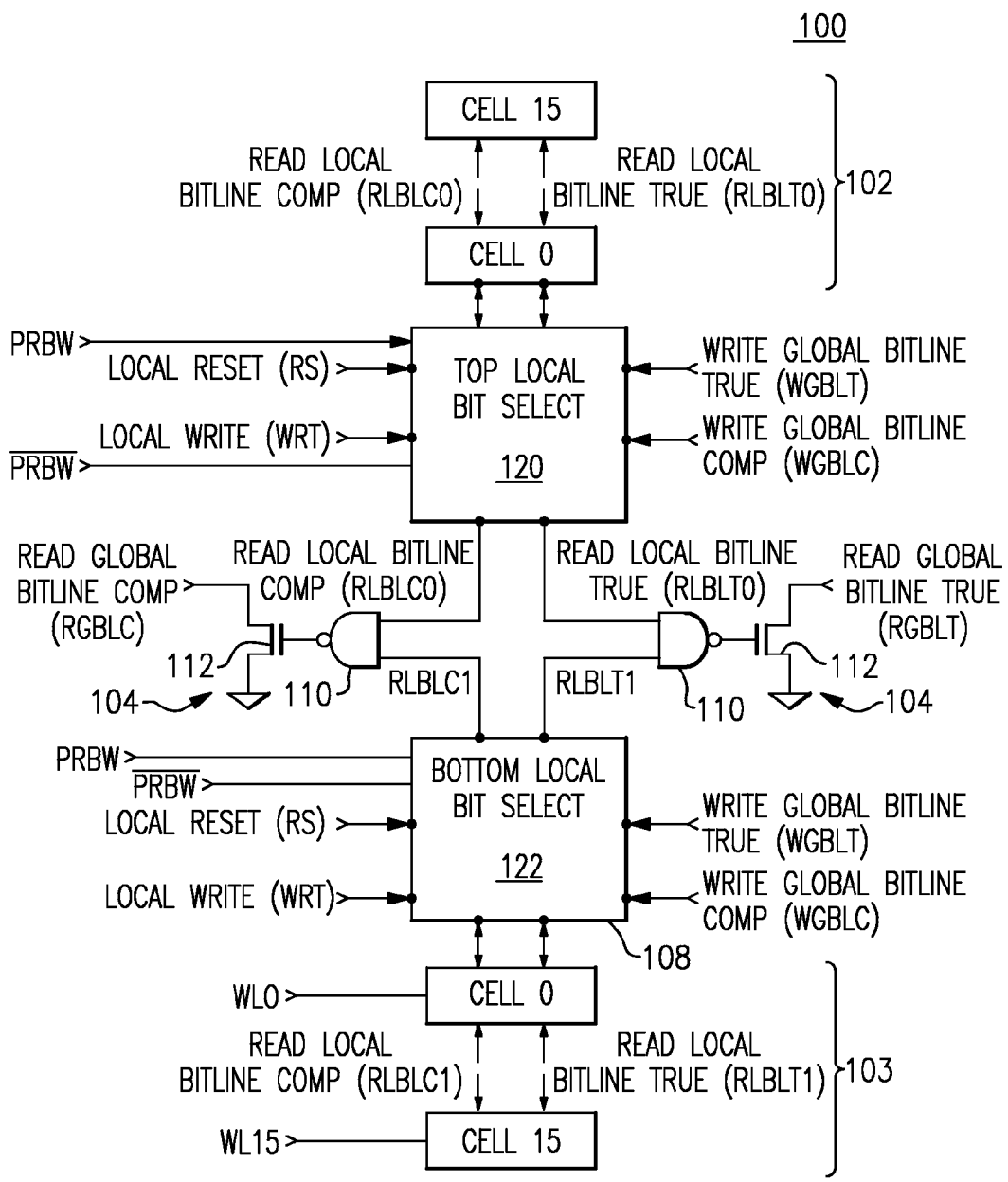
FIG. 4 is a schematic block diagram illustrating a structure of an SRAM having a plurality of memory arrays and a plurality of local bit-select circuits, each local bit-select circuit being connected to one of the memory arrays.

An SRAM 100 in accordance with an embodiment of the invention is illustrated in FIG. 4. As seen in FIG. 4, the SRAM includes a top memory array 102 and a bottom memory array 103. The "top" and "bottom" refer to different locations of the SRAM, but do not necessarily refer to top and bottom layout locations. Moreover, "top" and "bottom" typically do not refer to elements which are disposed at a top and a bottom in a gravitational frame of reference. Each of the memory arrays 102, 103 includes a multiplicity of memory cells which are arranged in a plurality of columns and a plurality of rows. One column of each memory array is shown in FIG. 4, each column illustratively shown having 16 memory cells numbered Cell 0 through Cell 15, the memory cells of each memory array being connected to a read local bitline complement (RLBLC0) and a read local bitline true (RLBLT0) which operate as busses for the transfer of bit values to and from the memory cells of each column. Typically, each memory array 102 will have many columns. For ease of description, the full number of columns of each memory array is omitted from FIG. 4. The number of rows of a memory array typically matches the number of memory cells in each column, such that in the example shown in FIG. 4, each memory array has 16 rows. The memory cells of each row of a memory array 102 or 103 can be activated for read or write operations by altering the voltage on a wordline connected thereto, e.g., wordline WL0 connected to memory cell 0 of array 103, and wordline WL15 connected to memory cell 15 of array 103.

As also seen in FIG. 4, the SRAM includes global read circuits 104, a top local bit-select circuit 106, a bottom local bit-select circuit 108, and associated control signals, which will be described in further detail below. The purpose of each global read circuit 104 is to buffer a read signal from the memory cell being read in one of the memory arrays 102, 103 and to provide the buffered read signal to external circuitry (not shown) of the SRAM. The global read circuits 104 include logic gates 110 having inputs connected to read local bitlines RLBLT0, RLBLC0 of the column for the memory array 102, and to the read local bitlines RLBLT1, RLBLC1 for the column for the memory array 103. When reading the value stored in a memory cell, a wordline connected to a memory cell is activated, for example, WL15 connected to memory cell 15 of bottom memory array 103 is activated, causing the bit value stored in memory cell 15 to be transmitted onto the read local bitlines RLBLT1 and RLBLC1. The logic gates 110 and the pull-down devices 112 then buffer the RLBLT1, RLBLC1 values, thus outputting the values onto the paired signal lines of read global bitline true (RGBLT) and read global read bitline complement (RGBLC). The read global bitline signals RGBLT and RGBLC then can be transferred to an external circuit, such as to a data input output circuit (not shown) for the SRAM or a data input output circuit for the integrated circuit in which the SRAM is incorporated.

A top local bit select circuit 120 is provided for memory array 102 and a bottom local bit select circuit 122 is provided for memory array 103. These circuits share the global read circuits 104 and receive the same pair of signals WRITE GLOBAL BITLINE TRUE (WGBLT) and WRITE GLOBAL BITLINE COMPLEMENT (WGBLC). However, each of the top bit-select circuit 120 and the bottom bit-select circuit 122 receives a local reset (RS) signal and a local write (WRT) signal which is independent from the local reset (RS) signal and local write (WRT) signal provided to the other one of the bit-select circuits. In one embodiment, each local bit-select circuit 120, 122 also receives a programmable read before write (PRBW) signal and an opposite polarity signal (/PRBW). As will be described in further detail below, these programmable signals PRBW and /PRBW can be set to levels which address a timing mismatch between the time a memory cell is activated (i.e., due to the activation of a wordline connected thereto), and the timing of a local write signal WRT provided to the local bit-select circuit.

Figure 5:
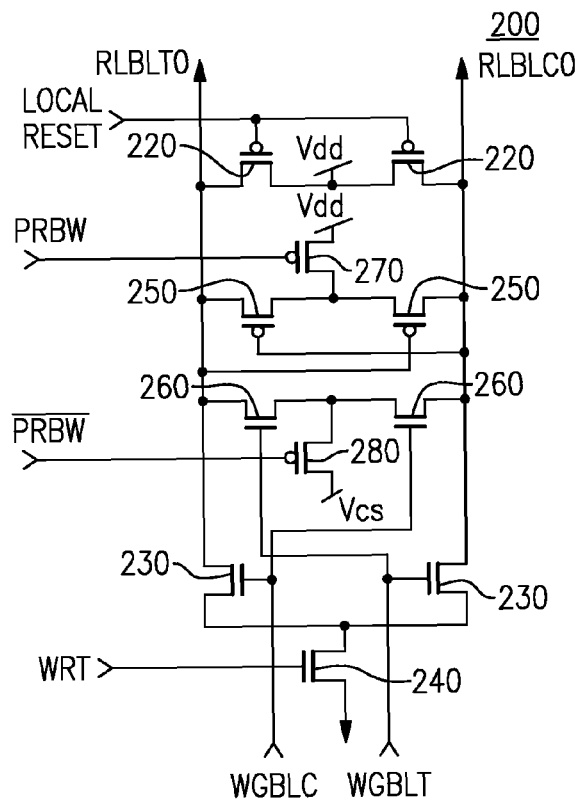
FIG. 5 is a schematic diagram illustrating a local bit-select circuit in accordance with an embodiment of the invention.

FIG. 5 shows an example of a local bit-select circuit 200 in accordance with an embodiment of the invention. Thus, the LOCAL RESET signal functions to restore the voltages on the pair of read local bitlines RLBLT0 and RLBLC0 to a power supply voltage Vdd, using pull-up devices 220 having source terminals connected to Vdd. The local bit-select circuit includes a pair of cross-coupled PFET devices 250, each such device 250 having a drain terminal connected to one of RLBLT0 and RLBLC0, and each PFET device 250 having a gate terminal connected to the other one of RLBLT0 and RLBLC0. A pair of pull-down devices 230 have source-drain conduction paths connected to RLBLT0 and RLBLC0, respectively. The local bit-select circuit also includes a pair of cross-coupled NFET devices 260, wherein each NFET device 260 has a source terminal connected to one of RLBLT0 and RLBLC0, and each NFET device 260 has a gate terminal connected to the gate of the pull-down device 230 whose current conduction path is connected to the other one of RLBLT0 and RLBLC0. Stated another way, the NFET 260 whose source terminal is connected to RLBLC0 has a gate terminal connected to the gate terminal of the pull-down device 230 whose drain terminal is connected to RLBLT0, and the NFET 260 whose source terminal is connected to RLBLT0 has a gate terminal connected to the gate terminal of the pull-down device 230 whose drain terminal is connected to RLBLC0.

A write control device 240 of the local bit-select circuit 200 receives a write control signal WRT which turns on device 240 at an appropriate time to cause values on the pair of true and complementary write global bitlines WGBLT and WGBLC to be written to a memory cell (e.g., memory cell 0 of memory array 103; FIG. 4). Writing to that memory cell occurs through bit value signals transmitted to the memory cell on the read local bitline pair RLBLT0 and RLBLC0 when the write control signal WRT provided to the selected local bit-select circuit 200 (FIG. 5) and the wordline WL0 (FIG. 4) corresponding to the particular row (i.e., a zeroth row) of memory cells of the memory array 103 is currently activated.

As further seen in FIG. 5, the source terminals of the PFETs 250 are coupled together to the drain of a first control device 270. In one embodiment, the first control device 270 is a PFET whose drain is connected to the sources of the PFETs 250. The first control device has a source terminal connected to a first power supply Vdd. As seen in FIG. 5, a programmable voltage level PRBW is supplied to a gate of the PFET 270. In one embodiment, the programmable voltage level can be set to a level which operates the PFET in either a saturated or unsaturated mode. Specifically, when the level of PRBW turns the PFET 270 fully on, PFET 270 can operate in saturation. In such condition, the PFET 270 will operate to provide current to the cross-coupled PFETs 250, which then amplify a small signal present on the read local bitlines RLBLT0 and RLBLC0 to pull up the voltage level of one of the read local bitlines RLBLT0 and RLBLC0. At the same time, in amplifying the small signal on RLBLT0 and RLBLC0, the cross-coupled PFETs 250 will drive down the voltage level on the other one of RLBLT0 and RLBLC0.

However a different benefit may be achieved when the PFET 270 is operated in a non-saturated regime. In that case, PFET 270 will be resistive in nature, and there can be a voltage drop between the source and drain terminals of the PFET 270. In such way, the local bit-select circuit can be operated so as to provide a programmably controlled resistance between the voltage supply, e.g., Vdd, and the source terminals of the cross-coupled PFETs 250. The programmably controlled resistance can limit the current that is sourced from the voltage supply Vdd to the cross-coupled PFETs 250, and in turn, limit the speed at which the cross-coupled PFETs 250 amplify the signals on RLBLT0 and RLBLC0 into rail-to-rail signals. The PRBW level should be sufficient to amplify the signals on RLBLT0 and RLBLC0 once the WRT signal becomes active. However, if the PRBW level is higher than necessary, then the PFETs 250 might undesirably amplify the read signals which can appear on RLBLT0 and RLBLC0 prior to WRT becoming active. Therefore, the PRBW level can be programmed to a selected level that provides the correct amount of amplification at the correct point in time to amplify the RLBLT0 and RLBLC0 signals while reducing the amplification of the read signals prior to WRT become active at the local bit-select circuit. The amplitude, timing of, or duty cycle of the signal PRBW can be set by programming to further this goal.

In addition to the cross-coupled PFETs and the first control device 270 used to achieve the above-discussed result, the local bit-select circuit further includes a second control device, typically a PFET 280, which has a source terminal connected to a voltage supply (e.g., a column select voltage supply Vcs), and which has a drain terminal connected to the drain terminals of the cross-coupled NFETs 260. The second control device 280 receives a signal /PRBW having a programmed voltage level at its gate. The signal /PRBW can have a polarity opposite that of PRBW connected to device 270. In one embodiment, /PRBW can be an inverted version of the voltage level PRBW provided to the first control device 270. Typically, the signal /PRBW can be programmed to a level which operates device 280 in an unsaturated regime of operation. Specifically, device 280 can operate in a regime in which device 280 is resistive, i.e., a regime which can generate a voltage drop between the source and drain terminals thereof, while the device 280 can control a flow of current from the voltage supply Vcs to the cross-coupled NFETs 260. The amplitude, timing of, or duty cycle of the signal /PRBW can be set by programming to further this goal. In one embodiment, the amplitude, timing and duty cycle of /PRBW can be set independently from the amplitude, timing and duty cycle of PRBW. With such control devices 270, 280 and the programmed signals PRBW and /PRBW supplied thereto, the local bit-select circuit 200 can be operated to satisfy a wide range of conditions and supply voltage levels Vdd and Vcs supplied thereto and to the SRAM.

In one embodiment, the PRBW and /PRBW signals can be programmed at values such that either the pair of cross-coupled NFETs or the pair of cross-coupled PFETs are activated at one time, but not both. In that way, a programmed amount of amplification can be provided to the circuit 200 by either pair 250 or 260 of cross-coupled devices, but both pairs of devices need not be active together. In one embodiment, the cross-coupled PFETs, or the cross-coupled NFETs can be programmed by the PRBW and /PRBW signals to have sufficient strength during the write cycle to fully overcome a strength of read signals which can appear on the read local bitlines RLBLT0 and RLBLC0 when an SRAM cell that is being written is activated, i.e., by activation of the wordline, but before the write control signal WRT has become active.

Another way the function of the first and second control devices 270, 280 can be described is that the first and second devices can be driven by the programmed amplitudes of the first and second PRBW and /PRBW signals to deliver sufficient current to avoid read signals on the read local bitlines RLBLT0 and RLBLC0 from being latched at rail-to-rail levels before the activation of the write control signal WRT.

Figure 6:
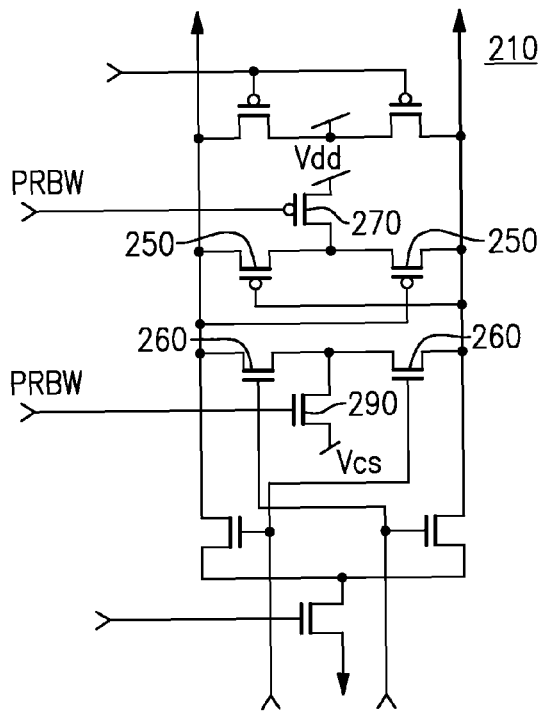
FIG. 6 is a schematic diagram illustrating a variation of a local bit-select circuit in accordance with an embodiment of the invention.

FIG. 6 is a schematic diagram illustrating a local bit-select circuit 210 according to a variation of the embodiment shown and described above with reference to FIG. 5. In this variation, an NFET 290 is used as the second control device instead of a PFET 280, as seen in the above-described circuit 200. In addition, the same PRBW signal can be provided to both the first control device 270 and the second control device 290. Because of the different level of a signal required to turn on a PFET (typically, a negative gate voltage level lower than some negative value such as −0.3 V) as compared to an NFET (typically, a positive gate voltage level such as +0.5 V), only one of the first and second control devices 270, 290 will be active at one time. In addition, when PRBW is a constant level, only one of the pairs of cross-coupled PFETs 250 or NFETs 260 will be utilized to address the above-discussed timing mismatch concerns.

Figure 7:
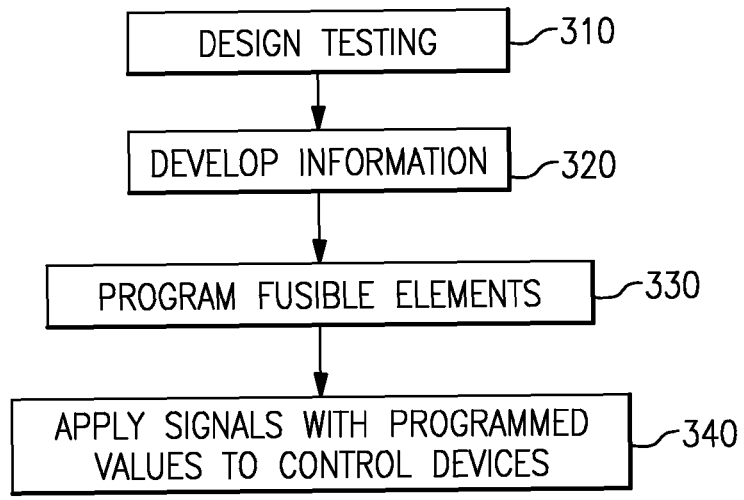
FIG. 7 is a flow diagram illustrating a method in accordance with an embodiment of the invention.

FIG. 7 is a flow diagram illustrating a method of programming a local bit-select circuit (200: FIG. 5; or 210: FIG. 6) in accordance with an embodiment of the invention. Such method can be used to control the levels of PRBW and /PRBW, if present, which are supplied to the first and second control devices as described above. As seen in FIG. 7, an electronic representation of the SRAM can be tested in a design phase (block 310) to verify timing of signals therein and determine the existence of any timing mismatches and problems, such as the above-discussed read-before-write problem. The testing can produce statistical information (block 320) concerning memory cells and bit-select circuits from different parts of an integrated circuit (i.e., the semiconductor chip) which incorporates the SRAM, particularly as relates to the presence or absence of the read-before-write effect, and how strong such effect is in the SRAM. In a particular embodiment, the testing can produce statistical information concerning the strength of any read-before-write effect observed in the operation of bit-select circuits on chips having different locations on the same wafer, when spatial variations in processing produce differences in test results at different locations. With the statistical information, fusible elements on the chip can be programmed (block 330) by selecting particular voltage levels for PRBW and /PRBW, if present, which are likely to reduce the adverse effect of a read-before-write produce the greatest benefit. In one embodiment, it may be desirable to store values of PRBW and /PRBW, if present, using fusible elements, e.g., fuses, laser fuses, electrical fuses, antifuses, or the like, which are provided on the chip which incorporates the SRAM. In one embodiment, information inputted and stored in the integrated circuit can be used to establish the programmed values of the PRBW and /PRBW levels, if present. Then, when the chip is powered on during operation, signals having the programmed values can be applied from the values stored on the fusible elements on the chip (block 340) to the first and second control devices as PRBW and /PRBW, if present.

Figure 8:
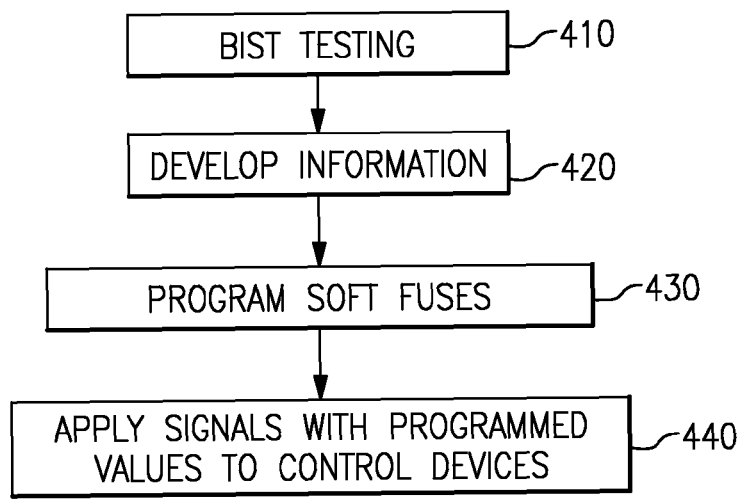
FIG. 8 is a flow diagram illustrating a method in accordance with an embodiment of the invention.

FIG. 8 is a flow diagram illustrating a variation of the above-described method (FIG. 7) in which testing in form of a built-in-self-test ("BIST")(block 410) on the chip is used in place of design verification to determine the strength of any read-before-write effect of concern to operation of the SRAM. Development of information (block 420), e.g., statistical information, can be as described above (FIG. 7). Another variation from the method described relative to FIG. 7 is that the value of the PRBW level and the /PRBW level, if any, can be programmed in "soft" fuses provided on the SRAM. For example, soft fuses can be provided in form of effectively non-volatile storage elements which are loaded with non-volatilely stored configuration information stored at an off-chip location when being powered on. "Soft" fuses might also be implemented in form of rewriteable on-chip non-volatile storage elements such as flash memory storage elements, among others. As in the above case, signals having the programmed values can be applied from the values stored on the "soft" fuses (block 440) to the first and second control devices as PRBW and /PRBW, if present.

Figure 9:
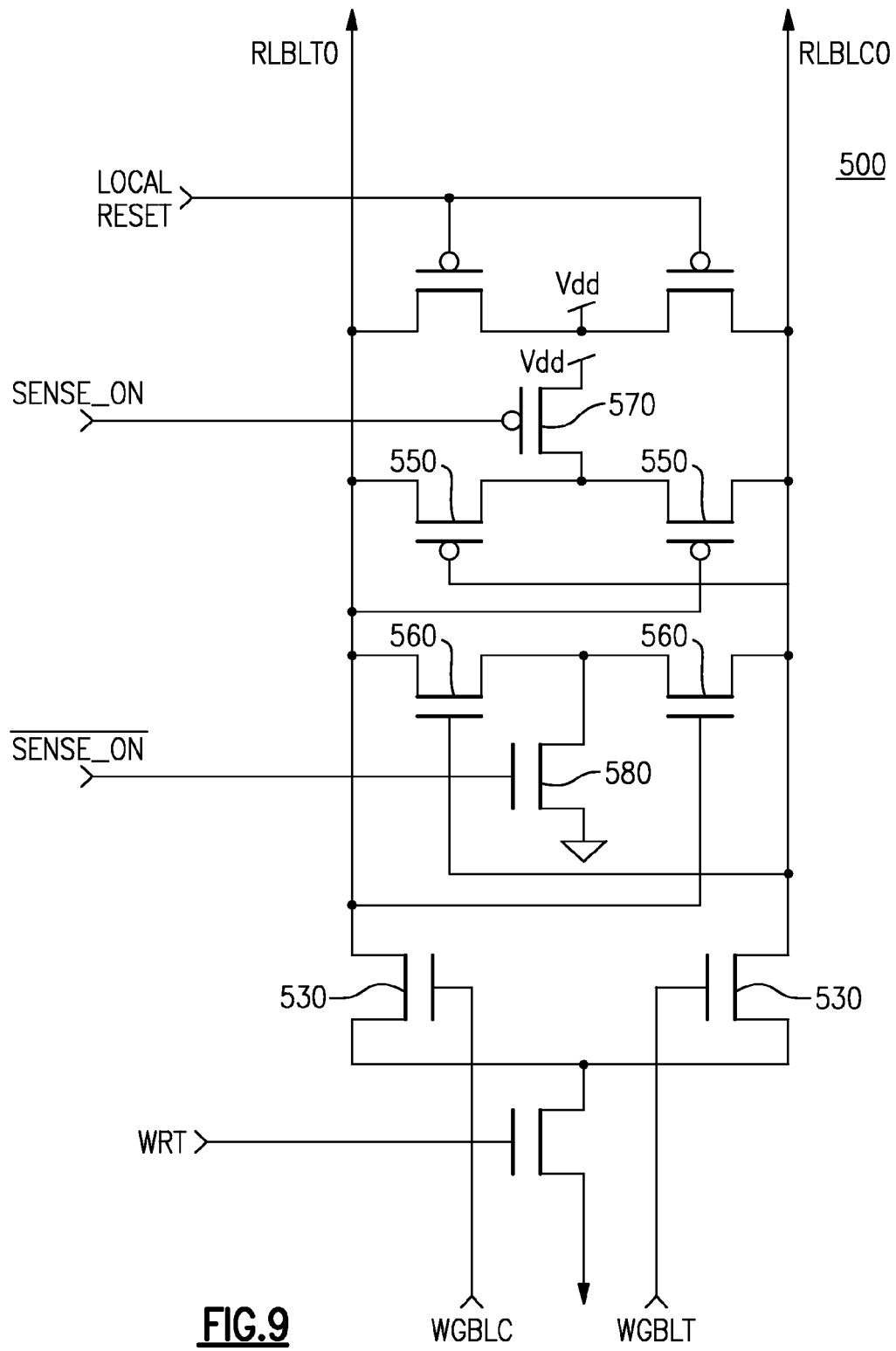
FIG. 9 is a schematic diagram illustrating a sense amplifier circuit in accordance with an embodiment of the invention.

In another embodiment (FIG. 9), the circuit shown in FIG. 5 can be modified for use as a sense amplifier 500 which is connected to true and complementary read local bitlines RLBLC0 and RLBLT0 of a memory array. The sense amplifier can be connected to a memory array of an SRAM, for example. In this case, the NFETs 560 can be connected in cross-coupled manner to the read local bitlines RLBLT0 and RLBLC0. In addition, there are no direct connections between the gates of NFETs 560 and the gates of the pull-down NFETs 530 in this embodiment. The sense amplifier can be operated by SENSE_ON and /SENSE_ON which are connected to the gates of the pull-up device 570 and of a pull-down device 580, respectively. The SENSE_ON and /SENSE_ON signals can be complementary, i.e., opposite in polarity and having the same timing. Alternatively, these signals can be opposite in polarity but with different timing. In one embodiment, the amplitudes, timings and duty cycles of the SENSE_ON and /SENSE_ON signals can be different.

In one embodiment, the sense amplifier 500 provides strong, controllable amplification by providing SENSE_ON and /SENSE_ON signals having a slight delay between the active edges thereof, so as to separately control the timing or degree of the amplification by the cross-coupled PFETs 550 via the SENSE_ON signal and the timing or degree amplification by the cross-coupled NFETs 560 via the /SENSE_ON signal. In addition, as in the above-described embodiment (FIG. 5), the high and low signal levels and duty cycles of SENSE_ON and /SENSE_ON can be provided as programmed signal levels and programmed duty cycles such as described above (FIG. 5). In this way, the SENSE_ON and /SENSE_ON signals can be programmed to allow RLBLC0 and RLBLT0 to be latched during a write operation only after the write control signal WRT has activated the sense amplifier 500. In one embodiment, a large number of cells can be connected to the pair of true and complementary read local bitlines RLBLT0 and RLBLC0 served by the sense amplifier 500, because one sense amplifier can be provided for each column of the memory array.

In a variation of the above embodiment (FIG. 9), the sense amplifier 500 can be connected to a memory array of a dynamic random access memory (DRAM).

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An integrated circuit including a static random access memory, comprising:
    a static random access memory ("SRAM") array including an array of memory cells arranged in columns, each column of memory cells being connected to true and complementary read local bitlines RLBLT and RLBLC;
    a local bit-select circuit connected to memory cells of the SRAM array, the local bit-select circuit including:
    first and second pull-down devices, each having a current conduction path connected to one of RLBLT and RLBLC to pull down a voltage of a respective one of RLBLT and RLBLC at a timing controlled by a write control signal WRT;
    a pair of cross-coupled p-type field effect transistors ("PFETs") including a first PFET having a gate connected to RLBLT and having a drain connected to RLBLC, and a second PFET of the pair having a gate connected to RLBLC and having a drain connected to RLBLT;
    a first device having a current conduction path connected between sources of the cross-coupled PFETs and a first voltage supply;
    a pair of cross-coupled n-type field effect transistors ("NFETs") including a first NFET having a source coupled to RLBLT and having a gate connected to the pull-down device whose current conduction path is connected to RLBLC, and a second NFET having a source coupled to RLBLC and having a gate connected to the pull-down device whose current conduction path is connected to RLBLT; and
    a second device having a current conduction path connected between sources of the cross-coupled NFETs and a second voltage supply,
    the first and second devices being controlled by applying a first signal to the first device, applying a second signal to the second device, the first and second signals having programmed levels, the programmed levels being less than a voltage of at least one of said first or second voltage supplies, wherein the first and second signals selectively activate either the first device or the second device, so as to selectively activate either the cross-coupled PFETs or the cross-coupled NFETs.

2. An integrated circuit as claimed in claim 1, wherein the first device is a PFET, the second device is an NFET, and the first and second signals are the same signal applied to each of the first and second devices.

3. An integrated circuit as claimed in claim 1, wherein the first device is a PFET, the second device is a PFET, and the second signal is complementary to the first signal.

4. An integrated circuit as claimed in claim 1, wherein programmed levels of the first and second signals are sufficient to cause at least one of the pair of cross-coupled PFETs or the pair of cross-coupled NFETs to overcome a strength of read signals on the true and complementary read local bitlines RLBLT and RLBLC when an SRAM cell being written is activated prior to an activation of the write control signal.

5. An integrated circuit as claimed in claim 4, wherein the first and second devices are driven by the programmed levels of the first and second signals to deliver sufficient current to avoid latching of read signals on the true and complementary read local bitlines RLBLT and RLBLC.

6. An integrated circuit as claimed in claim 5, wherein the levels of the first and second signals are programmed to a variable level in accordance with statistical information concerning strength of a read-before-write effect of the local bit-select circuit to be addressed by applying the first and second signals to the SRAM.

7. An integrated circuit as claimed in claim 6, wherein the programmed variable levels of the first and second signals are established by information inputted and stored to the integrated circuit, the information being generated in response to design-phase testing of an electronic representation of the SRAM.

8. An integrated circuit as claimed in claim 6, wherein the programmed levels of the first and second signals are established by information inputted and stored to the integrated circuit, the information being generated in response to built-in-self-test testing of the SRAM.

9. An integrated circuit as claimed in claim 8, wherein the SRAM further comprises a plurality of fusible elements storing the information establishing the programmed levels of the first and second signals.

10. An integrated circuit including a sense amplifier for amplifying bit signals for reading from and writing to a memory array, comprising:
 first and second pull-down devices, each having a current conduction path connected to one of true and complementary read local bitlines RLBLT and RLBLC to pull down a voltage of a respective one of RLBLT and RLBLC at a timing controlled by a write control signal WRT;
 a pair of cross-coupled p-type field effect transistors ("PFETs") including a first PFET having a gate connected to RLBLT and having a drain connected to RLBLC, and a second PFET of the pair having a gate connected to RLBLC and having a drain connected to RLBLT;
 a first device having a current conduction path connected between sources of the cross-coupled PFETs and a first voltage supply;
 a pair of cross-coupled n-type field effect transistors ("NFETs") including a first NFET having a gate connected to RLBLT and having a drain connected to RLBLC, and a second PFET of the pair having a gate connected to RLBLC and having a drain connected to RLBLT; and
 a second device having a current conduction path connected between sources of the cross-coupled NFETs and a second voltage supply,
 the first and second devices being controlled by applying a first signal to the first device, applying a second signal to the second device, the first and second signals having programmed levels, the programmed levels being less than a voltage of at least one of said first or second voltage supplies, wherein the first and second signals are operable to activate the first device and the second device at timings controlled in accordance with the programmed levels of the first and second signals.

11. A method, comprising:
a) operating a local bit-select circuit of a static random access memory ("SRAM"), the static random access memory ("SRAM") array including a multiplicity of memory cells, each memory cell being connected to true and complementary read local bitlines RLBLT and RLBLC, wherein the operating includes:
b) applying a first signal to a first device having a current conduction path connected between sources of cross-coupled PFETs and a first voltage supply, the PFETs having drains connected to the respective read local bitlines; and
c) applying a second signal to a second device having a current conduction path connected between drains of the cross-coupled NFETs and a second voltage supply, the first and second signals having programmed levels, the programmed levels being less than a voltage of at least one of said first or second voltage supplies, wherein the first and second signals selectively activate either the first or the second devices, so as to selectively activate either the cross-coupled PFETs or the cross-coupled NFETs, wherein the programmed levels of the first and second signals control a variable strength of the cross-coupled PFETs or the cross-coupled NFETs in reducing a fast-read-before-write effect when the local bit-select circuit receives a write control signal after a selected memory cell is activated.

12. A method as claimed in claim 11, wherein the first device is a PFET, the second device is an NFET, and the first and second signals are the same signal applied to each of the first and second devices.

13. A method as claimed in claim 11, wherein the first device is a PFET, the second device is a PFET, and the second signal is complementary to the first signal.

14. A method as claimed in claim 11, wherein the programmed levels of the first and second signals are sufficient to cause at least one of the pair of cross-coupled PFETs or the pair of cross-coupled NFETs to overcome a strength of read signals on the true and complementary read local bitlines RLBLT and RLBLC when an SRAM cell being written is activated prior to an activation of the write control signal.

15. A method as claimed in claim 14, wherein step (c) includes driving the first and second devices by the programmed levels of the first and second signals to deliver sufficient current to avoid latching of read signals on the true and complementary read local bitlines RLBLT and RLBLC.

16. A method as claimed in claim 15, further comprising programming the levels of the first and second signals to a variable level in accordance with statistical information concerning strength of a read-before-write effect of the local bit-select circuit to be addressed.

17. A method as claimed in claim 16, further comprising: generating information in response to design-phase testing of an electronic representation of the SRAM, and establishing the programmed variable levels of the first and second signals in accordance with the generated information.

18. A method as claimed in claim 16, further comprising: generating information in response to built-in-self-test testing of the SRAM, and establishing the levels of the first and second signals in accordance with the generated information.

19. A method as claimed in claim 11, wherein the establishing the programmed levels of the first and second signals includes altering states of a plurality of fusible elements.

20. A method as claimed in claim 18, wherein the establishing the programmed levels of the first and second signals includes altering states of a plurality of soft fuses of the SRAM.

* * * * *